United States Patent [19]

Chu

[11] Patent Number: 4,975,761
[45] Date of Patent: Dec. 4, 1990

[54] HIGH PERFORMANCE PLASTIC ENCAPSULATED PACKAGE FOR INTEGRATED CIRCUIT DIE

[75] Inventor: George D. Chu, Newark, Calif.

[73] Assignee: Advanced Micro Devices, Inc., Sunnyvale, Calif.

[21] Appl. No.: 402,940

[22] Filed: Sep. 5, 1989

[51] Int. Cl.$^5$ .................. H01L 23/28; H01L 23/02
[52] U.S. Cl. ........................... 357/72; 357/81; 357/74; 361/386
[58] Field of Search ............... 357/72, 74, 81; 361/386

[56] References Cited

U.S. PATENT DOCUMENTS

| | | | |
|---|---|---|---|
| 3,838,984 | 10/1974 | Crane et al. | 29/193.5 |
| 4,074,342 | 2/1978 | Honn et al. | 361/411 |
| 4,288,841 | 9/1981 | Gogal | 361/414 |
| 4,380,566 | 4/1983 | Phy | 428/192 |
| 4,407,007 | 9/1983 | Desai et al. | 357/74 |
| 4,410,927 | 10/1983 | Butt | 361/386 |
| 4,680,613 | 7/1987 | Daniels et al. | 357/72 |
| 4,725,878 | 2/1988 | Miyauchi et al. | 357/80 |
| 4,801,999 | 1/1989 | Hayward et al. | 357/70 |
| 4,866,571 | 9/1989 | Butt | 361/386 |

FOREIGN PATENT DOCUMENTS

| | | |
|---|---|---|
| 2616963 | 12/1988 | France . |
| 0075446 | 5/1982 | Japan . |
| 0249462 | 10/1987 | Japan . |
| 0187650 | 8/1988 | Japan . |
| 0219144 | 9/1988 | Japan . |
| 0257255 | 10/1988 | Japan .................. 357/74 |

Primary Examiner—Andrew J. James
Assistant Examiner—Viet Q. Nguyen
Attorney, Agent, or Firm—John P. Taylor

[57] ABSTRACT

A high performance plastic-encapsulated integrated circuit package is disclosed having both improved heat dissipation and low ground noise comprising one or more separate ground and/or power planes below the signal lines which includes an electrically conductive heat sink member on which an integrated circuit die is centrally and directly mounted for dissipating heat while providing electrical insulation therebetween and which may also may function as a ground or power plane, a peripheral printed circuit board having electrically conductive members formed on one or more surfaces thereof, one surface of which is also mounted to the heat sink and electrically separated therefrom and which surrounds the centrally mounted die on the heat sink, and a lead frame assembly bonded to an opposite surface of the printed circuit board. Terminal pads on the die are connected respectively to leads on the lead frame, to the electrically conductive members on the printed circuit board, and to the electrically conductive heat sink. Terminal pads on one surface of the printed circuit board may be used in combination with electrically conductive vias to provide electrical connection to the other surface of the printed circuit board as well as to the electrically conductive heat sink.

19 Claims, 4 Drawing Sheets

HIGH PERFORMANCE PLASTIC ENCAPSULATED PACKAGE FOR INTEGRATED CIRCUIT DIE

BACKGROUND OF THE INVENTION

1. Field of the Invention

This invention relates to an improved plastic package for integrated circuit structures. More particularly, this invention relates to an improved plastic package for an integrated circuit structure which provides both heat dissipation and low ground bounce noise.

2. Description of the Related Art

In the conventional plastic-encapsulated packaging of integrated circuit structures, the die is conventionally attached to the center paddle of a metal lead frame which has a plurality of metal leads which fan out from a series of bonding pads arranged around the four sides of the die.

However, many high frequency and high power dissipating devices cannot be packaged into a plastic package due to ground noise and heat dissipation. The problem of heat dissipation has been addressed in plastic packaging by placing a heat spreader in a mold which improves the heat characteristics. For example, in Butt U.S. Pat. No. 4,410,927, which teaches a casing for an electrical component such as an integrated circuit die, a metal base member is provided onto which the die is bonded using an epoxy adhesive. A lead frame is also sealed and bonded to the metal base member. Daniels et al U.S. Pat. No. 4,680,613 discloses a low impedance package for an integrated circuit die comprising a lead frame without a central paddle and a ground plate which forms the die attach plate and which is spaced from and parallel to the lead frame. A dielectric layer is formed between the lead frame and the ground plate.

It is also, of course, known to use printed circuit structures as a part of the lead frame structure, both in ceramic and non-ceramic packaging. For example, Crane et al U.S. Pat. No. 3,838,984 discloses a printed circuit lead frame for an integrated circuit structure which comprises an insulating sheet member with a plurality of inner via holes arranged in a pattern to match that of terminal contacts on a chip and a plurality of outer via holes arranged in a pattern to match terminal pads on a supporting substrate. Raised contacts or bumps in each of the inner and outer via holes extend beyond one surface to make a conductively bonded contact with the terminal pads on the chip and substrate. Printed circuit leads on the other surface intercouple pairs of outer and inner contacts to complete electrical coupling of the chip to the substrate.

Honn et al U.S. Pat. No. 4,074,342 describes an electrical package for LSI devices which comprises a carrier comprising a number of pins encapsulated in an organic materials with both ends of the pins protruding. One end of the pins may serve as connectors to a circuit transposer which may be either a semiconductor or an insulator which may have suitably disposed diffusions or deposited metal as conductive paths to link the attached semiconductor devices to the pins.

Gogal U.S. Pat. No. 4,288,841 teaches a double cavity ceramic chip carrier which comprises a multilayer ceramic sandwich with metallization patterns defined on the horizontal surfaces of each of a plurality of such ceramic layers.

Desai et al U.S. Pat. No. 4,407,007 describe a ceramic substrate comprising a series of laminated ceramic sheets with a semiconductor device mounted on the top surface of the substrate, I/O connections such as pins on the bottom surface, and an internal metallurgy system formed of printed conductive circuit patterns and filled vias on and in the sheets.

Miyauchi et al U.S. Pat. No. 4,725,878 describes a semiconductor device comprising an integrated circuit die mounted on a multilayer of insulative substrates with high speed signal leads having portions formed on the side surfaces of the package. Portions of the signal lines also comprise interlayers between the insulating substrates and part of the signal lines comprise wire through via holes in the substrates.

In Hayward et al U.S. Pat. No. 4,801,999, which is assigned to the assignee of this invention, there is shown a lead assembly in which leads and busses are arranged on both sides of a dielectric layer.

However, when such printed circuit layers are used in the package, a heat sink is usually not attached directly to the die. Furthermore, while the use of stacked ceramic layers is known, it is difficult to incorporate more than one layer in a plastic package due to difficulties and added expense in attempting to mold such a structure.

It would, therefore, be desirable to provide a plastic-encapsulated package for an integrated circuit which would provide both superior heat dissipation characteristics as well as providing improved noise-related electrical properties.

SUMMARY OF THE INVENTION

It is, therefore, an object of this invention to provide a high performance plastic-encapsulated package for an integrated circuit structure which will provide both improved heat dissipation and low ground noise by providing one or more separate ground and/or power planes adjacent the signal lines, one of which planes is also capable of dissipating heat.

It is another object of this invention to provide a high performance plastic-encapsulated package for an integrated circuit structure which will provide both improved heat dissipation and low ground noise comprising a central heat sink member on which a die is centrally mounted which may also function as a ground or power plane, a peripheral printed circuit board which surrounds the die and which is mounted to the heat sink and electrically separated therefrom, and a paddleless lead frame assembly which is bonded to the printed circuit board.

It is still another object of this invention to provide a high performance plastic-encapsulated package for an integrated circuit structure which will provide both improved heat dissipation and low ground noise comprising a central heat sink member on which a die is centrally mounted which may also function as a ground or power plane, depending upon whether the integrated circuit structure comprises a CMOS or bipolar device, a peripheral printed circuit board which surrounds the die and which is mounted to the heat sink and electrically separated therefrom, a paddleless lead frame assembly which is bonded to the printed circuit board, and electrical connections respectively from leads on the lead frame assembly to the central heat sink member and electrically conductive members on one or both sides of the printed circuit board These and other objects will be apparent from the following description and accompanying drawings.

DETAILED DESCRIPTION OF THE INVENTION

Figure 1:
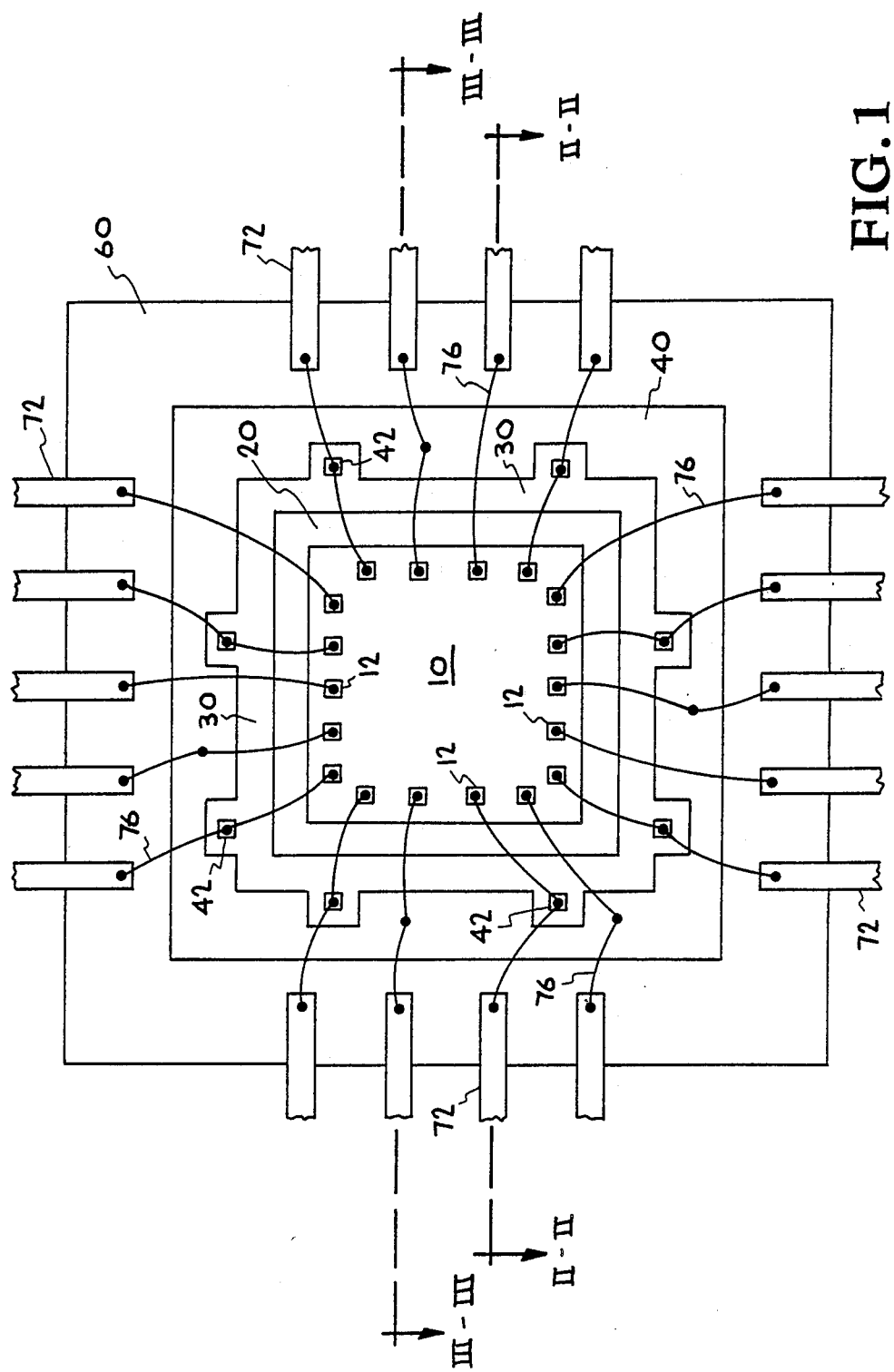
FIG. 1 is a top view of a first embodiment of the invention showing terminal pads on an integrated circuit die electrically connected either directly to a lead on the lead frame, connected to the lead frame and to the bus on the top surface of a pc board, or connected to the lead frame and to a separate contact pad on the top of the pc board to make contact either with the heat sink or a conductive pattern on the lower surface of the pc board through vias under the contact pads.

In accordance with the invention, a high performance plastic-encapsulated package integrated circuit structure is provided with good heat dissipation and low ground noise comprising one or more separate ground and/or power planes adjacent the signal lines which includes an integrated circuit die; a heat sink member on which the die is centrally mounted for dissipating heat and which also functions as either a ground or power plane; a peripheral printed circuit board, one face of which is also mounted to the heat sink and electrically separated therefrom and which surrounds the centrally mounted die on the heat sink; and a lead frame assembly insulatively bonded to an opposite face of the printed circuit board.

Turning to FIGS. 1-3 and 5, an integrated circuit die 10, which is generally rectangular, is shown centrally mounted on a rectangular metal heat sink 20 by an adhesive layer 14, such as an epoxy resin which bonds die 10 to heat sink 20 while providing electrical insulation therebetween. Die 10 may also be bonded to heat sink 20 using a tape with adhesive on both sides, such as used in tap automated bonding (TAB) systems, such as, for example, Kapton, a fully imidized polyimide material by DuPont.

Also bonded to heat sink 20 is a rectangular pc board 30 which may conveniently have the same outer dimensions as heat sink 20 for packaging purposes, but which may be somewhat larger or smaller than heat sink 20 if desired. Printed circuit board 30, which may have laminated thereto a number of insulating and conducting layers, as will be described below, may comprise a polyimide material or any other suitable insulating material.

Printed circuit board 30 is provided with a rectangular central opening 34 slighter larger than the dimensions of die 10 so that when die 10 and pc board 30 are both mounted to heat sink 20, the outer edges of die 10 are spaced from the edges of opening 34 in pc board 30, exposing a portion of the surface of heat sink 20 as shown in FIGS. 1-5. Thus when both pc board 30 and die 10 are mounted to the same surface of heat sink 20, pc board 30 will peripherally surround die 10 and be coplanar with it. Printed circuit board 30 will, therefore, sometimes be referred to herein as a peripheral pc board, in contrast to prior art pc boards which are located beneath the die rather than surrounding it.

Figure 2:
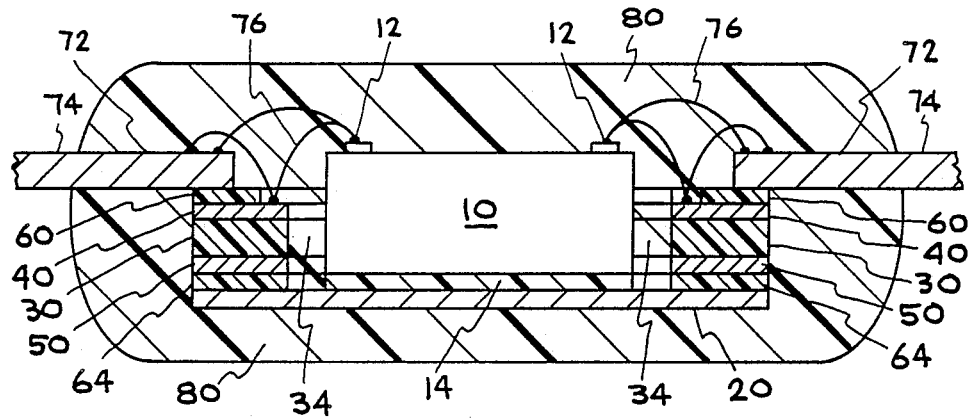
FIG. 2 is a vertical cross-sectional view of the embodiment of FIG. 1, taken along lines II—II, except that the metal pattern on the upper surface of the pc board is depicted as flush with the inner and outer edges of the pc board.
Figure 3:
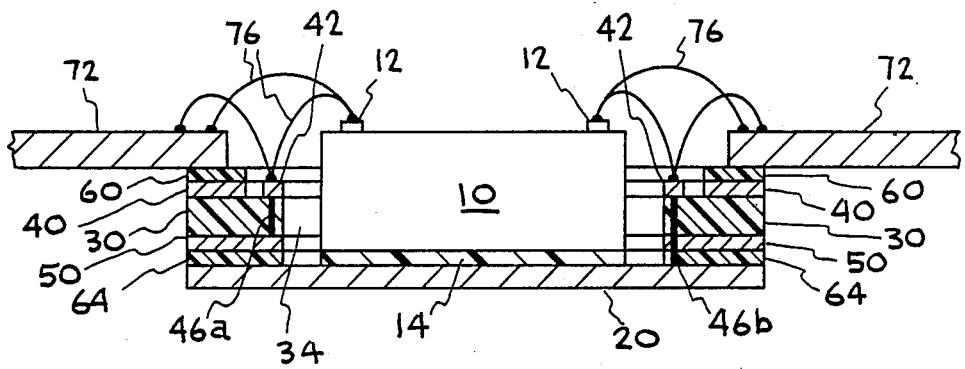
FIG. 3 is another vertical cross-sectional view of the embodiment of FIG. 1 taken along lines III—III, except that the terminal pads and metal pattern on the upper surface of the pc board are respectively depicted as flush with the inner and outer edges of the pc board. The pc board terminal pads are shown electrically connected through vias either to a pattern on the lower surface of the pc board or to the heat sink beneath the pc board.
Figure 5:
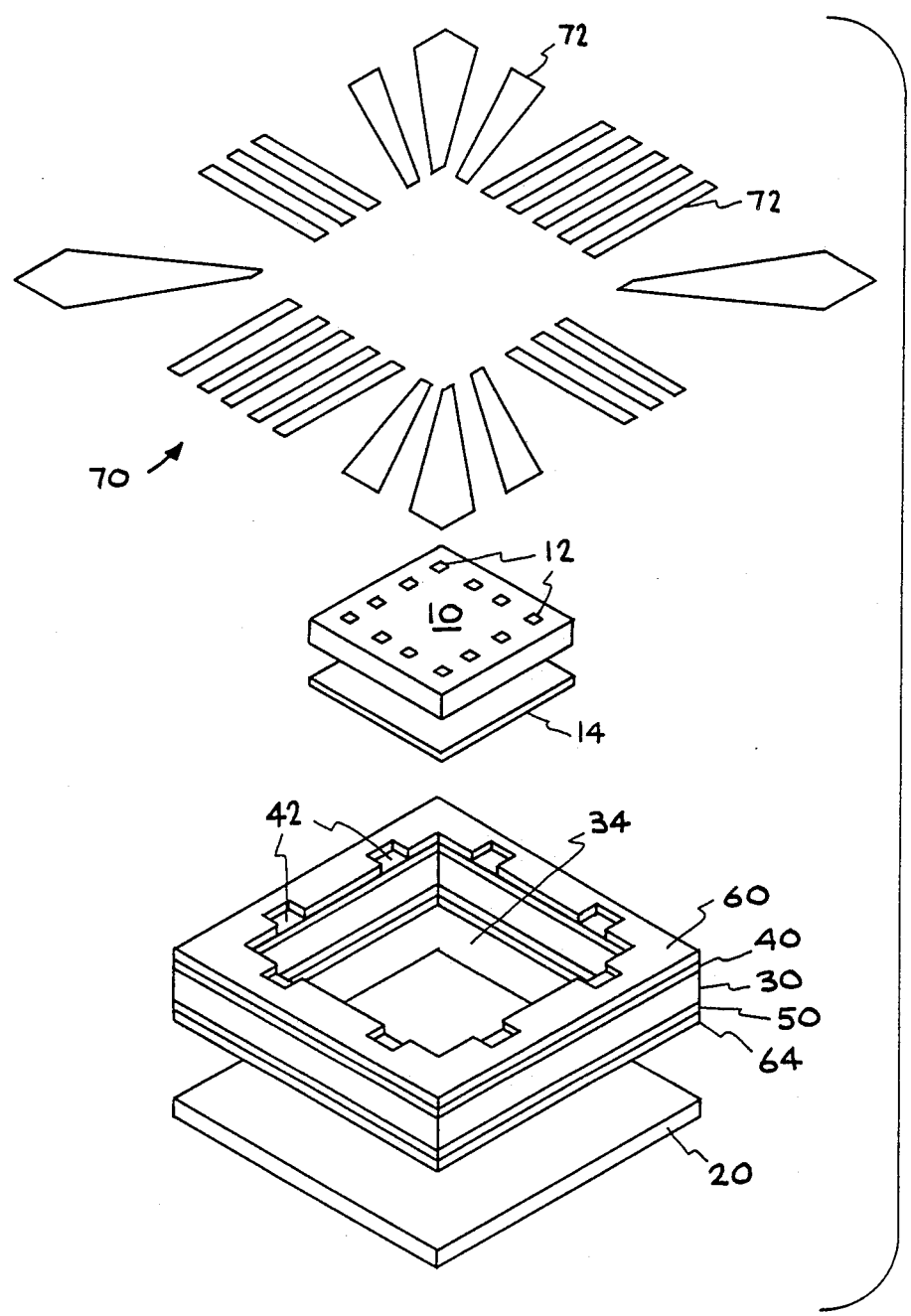
FIG. 5 is an exploded view of the structure shown in FIG. 1 except for the insulating layers which have been omitted for clarity.
Figure 6:
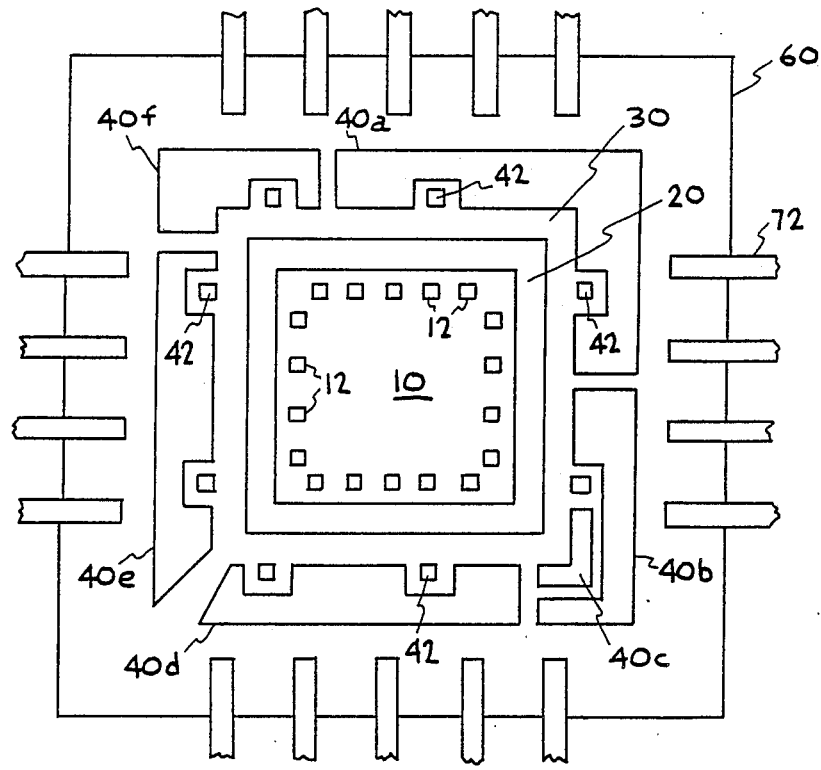
FIG. 6 is a top view of another embodiment of the invention similar to that shown in FIG. 1 except that the metal bus shown on the top surface of the pc board in FIG. 1 has been replaced by a pattern of metal lines.

Formed on the upper surface of pc board 30 is a metal layer 40 such as aluminum or copper which may comprise a solid bus, as shown in FIGS. 1 and 5, or may comprise a pattern of several lines or busses 40a-40f, as shown in FIG. 6. Also formed on the top surface of pc board 30 are a number of terminal pads 42 under which vias 46a and 46b, as shown in FIGS. 3, extend through pc board 30 to provide electrical contact to either heat sink 20 or a lower metal layer 50 which may be formed on the lower surface of pc board 30 as shown in FIGS. 2-3 and 5. Such a metal layer 50, when present may be fabricated similarly to metal layer 40, and may also comprise a single bus or a pattern of busses or lines.

Metal layer 40 and/or terminal pads 42 may laterally extend to the inner edge of pc board 30, if desired, as shown in FIGS. 2-5, or layer 40 and terminal pads 42 may terminate short of the inner edge of pc board 30, leaving a portion of the top surface of pc board 30 exposed, as shown in FIGS. 1 and 6. Similarly, metal layer or pattern 40 may terminate at the outer edge of pc board 30, as shown in FIGS. 2-5, or layer 40 may terminate short of the outer edge of pc board 30 as shown in FIGS. 1 and 6.

A layer of insulation 60, which may comprise a tape material having adhesive on both sides similarly to the tape discussed above with regard to bonding die 10 to heat sink 20, is placed over the top surface of pc board 30 to bond it to a lead frame 70, as will be described below, as well as to insulate lead frame 70 from metal layer or pattern 40 when metal layer 40 extends to the outer edge of pc board 30.

Figure 4:
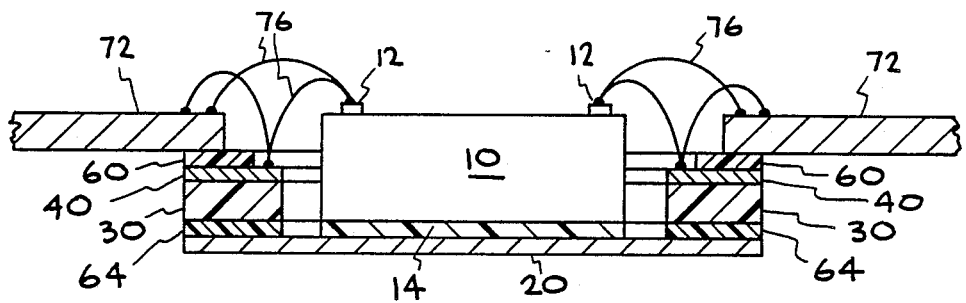
FIG. 4 is a vertical cross-sectional view of the structure shown in FIGS. 1-3 except for elimination of a metal conducting pattern on the lower side of the pc board.

When pc board 30 is provided with a second metal layer 50 bonded to the undersurface of pc board 30, as shown in FIGS. 2-3 and 5, a second layer of insulation 64, which may also comprise tape with adhesive on both sides, as discussed above, may be bonded to metal layer 50 to electrically insulate it from metal heat sink 20 which, in turn, is then bonded to insulation layer 64 or one may use a prepreg, which is commercially used with multi-layer boards to insulate the traces on two adjacent boards from one another. Alternatively, pc board 30 may be bonded to heat sink 20 using the earlier described epoxy adhesive 14 used to insulatively bond die 10 to heat sink 20. Either bonding method may also be used to bond heat sink 20 directly to pc board 30 when metal layer 50 is not present, as shown in FIG. 4.

Lead frame 70 which, as stated above, is bonded to insulating layer 60 over metal layer 40, may comprise a conventional lead frame formed, however, without a central die-mounting paddle. The inner edges of leads 72 of lead frame 70 may terminate at a point spaced from die 10 and generally adjacent the edge of opening 34 in pc board 30 as best seen in FIGS. 2–4. It should be noted, in this regard, that the spacing between the termination of the inner ends of leads 72 and the terminal pads 12 on die 10 may vary, depending upon the size of die 10.

When the spacing between the inner ends of leads 72 and the terminal pads 12 on die is large, metal traces 40a–40f may be formed on pc board 30, by patterning metal layer 40, for example, as shown in the embodiment of FIG. 6. Metal traces 40a–40f may then act as bridges between leads 72 and terminal pads 12, thereby avoiding the use of long wires between the leads and the die terminal pads.

With respect to the division of metal layer 40 into separate metal portions or traces 40a–40f, it should be noted that metal layer 50 could also be divided into a number of segments as well with respective vias extending down to electrically connect to each segment.

In any of the embodiments, electrical connection may be made to leads 72 on lead frame 70 through gold wires 76 which are then connected, at their opposite ends, either directly to metal bus layer 40, to metal traces portions 40a–40f, to terminal pads 42 on pc board 30, or to terminal pads 12 on die 10. If desired, a metal wire 76 also may be directly connected to heat sink 20 from either lead 72 or metal trace portions 40a–40f, rather than, as shown on the right in FIG. 3, through terminal pad 42 and via 46b.

In either manner of electrical connection, heat sink 20, for example, may be electrically connected, for example through via 46 as shown in FIG. 3, to function as a ground plane or Vss line and either metal layer 40 or metal layer 50 (through via 46a), for example, may be electrically connected to function as a power or Vcc bus to improve the electrical properties of the package.

It should also be noted that using heat sink 20 and/or metal layers 40 and/or 50 as Vcc and Vss busses, standardization of burn-in boards and possibly test interface boards may be accomplished by bonding the outer traces or leads from the Vcc and Vss busses to designated pins, such as corner pins, no matter where the inner trace of the Vcc or Vss busses may originate from. Only one board would then be required for one package since all external Vcc and Vss leads would be the same no matter where the inner Vss and Vcc pad locations may be. Also, such high current Vcc and Vss pins could be widened to reduce inductance and resistance.

After assembly of the structure by bonding die 10 to heat sink 20, peripheral pc board 30 to heat sink 20 around die 10, lead frame 70 to pc board 30, and the electrical connection of leads 72 respectively to terminal pads 12 on die 10, to metal layers or patterns 40 and 50, and to heat sink 20, the structure may be encapsulated. The structure is encapsulated in a suitable plastic encapsulating material such as an epoxy or polyimide resin 80, as shown in FIG. 2, leaving only the tips 74 of leads 72 exposed from the encapsulated package. Such plastic encapsulation is greatly facilitated by the preassembly of all of the components together, i.e., lead frame 70, die 10, heat sink 20, and pc board 30, prior to insertion into the encapsulation mold.

Figure 7:
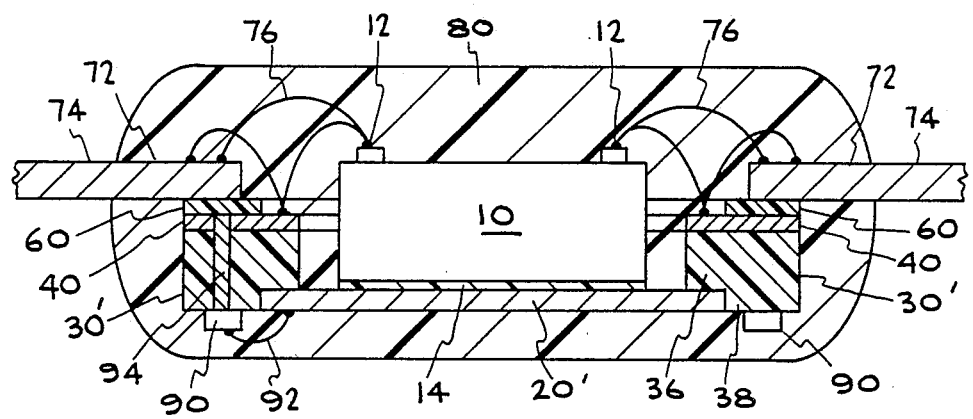
FIG. 7 is a vertical cross-sectional view of another embodiment of the invention having a structure similar to that of FIGS. 1-3 but with the addition of decoupling capacitors mounted to a portion of the pc board.

Turning to FIG. 7, another embodiment of the invention is shown wherein pc board 30' has been modified to provide a shoulder 36 to receive heat sink 20' leaving a portion 38 of the lower surface of pc board 30' exposed which permits the direct mounting thereto of one or more decoupling capacitors 90 which may, for example, be electrically connected between heat sink 20', functioning as the Vss line through lead 92, and through via 94 to metal layer 40, acting as a Vcc power bus.

It should be noted that, as previously discussed with respect to the embodiment of FIG. 6, a segmented lower metal layer 50 may also be provided in this embodiment to function, respectively for example, as Vss1, Vss2, Vcc1, and Vcc2 lines, with vias connecting each segment to an appropriate lead on the upper surface of the structure. In such case, for simplicity of construction, the segmented metal layer could be formed on the exposed portion 38 of pc board 30' electrically spaced from heat sink 20'. Capacitors 90 could then be formed, when desired, bridging between the segments to capacitively couple them together.

In any of the embodiments or modifications shown above, the resultant plastic-encapsulated integrated circuit package provides both excellent heat dissipation characteristics, by virtue of the bonding of die 10 directly to heat sink 20, as well as improved electrical properties by virtue of the provision of separate ground and power planes in the package. The use of such a structure also permits the mounting of decoupling capacitors to the structure prior to encapsulation to further enhance the electrical characteristics of the resulting molded package.

Having thus described the invention, what is claimed is:

1. A high performance plastic-encapsulated integrated circuit package characterized by both improved heat dissipation and low ground noise comprising one or more separate planes selected from the class consisting of a ground plane, a power plane, and combinations of same disposed in a parallel plane; and signal lines electrically connected to an integrated circuit die comprising:
    (a) an electrically conductive heat sink member capable of dissipating heat and which may also function as a ground or power plane;
    (b) an integrated circuit die having a first surface centrally and directly bonded to a first surface of said heat sink member, while providing electrical insulation therebetween, and having side surfaces thereon;
    (c) a printed circuit board, having a first surface, at least a portion of which is bonded to said first surface on said heat sink member to peripherally surround said side surfaces of said centrally mounted die on said heat sink surface, and a second surface on which is formed one or more electrically conductive members;
    (d) a lead frame assembly insulatively bonded to said second surface of said printed circuit board comprising one or more leads electrically connected at their inner ends respectively:
        (i) to terminal pads on said integrated circuit die;
        (ii) to said one or more of said electrically conductive members on said second face of said printed circuit board; and
        (iii) to said electrically conductive heat sink member; and (e) a plastic encapsulating material which completely surrounds said integrated circuit die, said heat sink, said printed circuit board, and said lead frame except for outer ends of said leads thereon.

2. The high performance plastic-encapsulated integrated circuit package of claim 1 wherein said first surface of said printed circuit board is also provided with one or more electrically conductive members, said electrically conductive heat sink member is insulatively mounted to said first surface of said printed circuit board, and one or more leads on said lead frame are also electrically connected to said one or more electrically conductive members on said first surface of said printed circuit board.

3. The high performance plastic-encapsulated integrated circuit package of claim 2 wherein electrically conductive terminal pads are also formed on said second surface of said printed circuit board and electrically conductive vias are formed beneath said terminal pads on said second surface of said printed circuit board extending through said printed circuit board to make electrical contact with said one or more electrically conductive members on said first surface of said printed circuit board.

4. The high performance plastic-encapsulated integrated circuit package of claim 3 wherein one or more of said electrically conductive vias extending through said printed circuit board make electrical contact with said metal heat sink member to which said printed circuit board is bonded to permit said metal heat sink member on said printed circuit board to function as a power or ground bus for said package.

5. The high performance plastic-encapsulated integrated circuit package of claim 3 wherein lead wires interconnect said leads on said lead frame with said terminal pads on said second surface of said printed circuit board and lead wires also interconnect said printed circuit board terminal pads with terminal pads on said die.

6. The high performance plastic-encapsulated integrated circuit package of claim 3 wherein lead wires connect said leads on said lead frame with said one or more electrically conductive members on said second surface of said printed circuit board and lead wires also interconnect said one or more electrically conductive members on said second surface of said printed circuit board with one or more terminal pads on said die.

7. The high performance plastic-encapsulated integrated circuit package of claim 3 wherein at least one of said one or more electrically conductive members on said second surface of said printed circuit board functions as a power or ground bus and two or more of said die terminal pads are electrically connected to said power or ground bus.

8. The high performance plastic-encapsulated integrated circuit package of claim 3 wherein at least one of said one or more electrically conductive members on said first surface of said printed circuit board functions as a power or ground bus and two or more of said die terminal pads are electrically connected through one or more of said terminal pads on said second surface of said printed circuit board and said vias thereunder to said power or ground bus.

9. The high performance plastic-encapsulated integrated circuit package of claim 4 wherein lead wires respectively electrically connect two or more of said die terminal pads with said heat sink member when said heat sink member also functions as a power or ground bus.

10. The high performance plastic-encapsulated integrated circuit package of claim 2 wherein said heat sink member is generally rectangular, said integrated circuit die, centrally mounted to said first surface of said heat sink member, is generally rectangular with side surfaces, and said peripheral printed circuit board is also generally rectangular with a generally rectangular opening centrally formed therein which is larger than said rectangular integrated circuit die to thereby expose a portion of said first surface of said heat sink member between said printed circuit board and said integrated circuit die when both said printed circuit board and said integrated circuit die are centrally mounted to said rectangular heat sink member.

11. The high performance plastic-encapsulated integrated circuit package of claim 10 wherein the respective first surfaces of said die and said printed circuit board are both bonded coplanarly to said first surface of said heat sink member whereby said printed circuit board surrounds said side surfaces of said die without interfering with the heat transfer from said first surface of said die to said first surface of said heat sink member.

12. The high performance plastic-encapsulated integrated circuit package of claim 2 wherein said second surface of said printed circuit board further includes terminal pads electrically connected respectively to one or more of said terminal pads on said integrated circuit die and to one or more of said leads on said lead frame; and said printed circuit board further comprises one or more vias which electrically connect said terminal pads on said second surface thereof respectively to said electrically conductive members on said first surface thereof and to said electrically conductive heat sink member.

13. A high performance plastic-encapsulated integrated circuit package characterized by both improved heat dissipation and low ground noise comprising one or more planes selected from the class consisting of a ground plane, a power plane, and combinations of same; and signal lines electrically connected to an integrated circuit die comprising:
(a) an electrically conductive rectangular heat sink member capable of dissipating heat and which may also function as a ground or power plane;
(b) a rectangular integrated circuit die having a first surface centrally and directly mounted to a first surface of said heat sink member, while providing electrical insulation therebetween, and having die terminal pads formed thereon;
(c) a generally rectangular printed circuit board having side surfaces and a first surface insulatively bonded to said electrically conductive heat sink member comprising:
 (i) one or more electrically conductive planar members formed on said first surface;
 (ii) a second surface having one or more electrically conductive planar members formed thereon and one or more terminal pads also formed thereon and electrically spaced from said electrically conductive planar members;
 (iii) electrically conductive vias formed therein to respectively electrically connect one or more of said terminal pads on said second surface to one or more of said electrically conductive planar members on said first surface of said printed circuit board and to said electrically conductive heat sink member to which said printed circuit board is bonded; and (iv) a generally rectangular opening centrally formed therein which is larger than said rectangular integrated circuit die, whereby said rectangular printed circuit board generally surrounds said centrally mounted die on said first heat sink surface;

(d) a lead frame assembly insulatively bonded to said second surface of said printed circuit board comprising one or more leads electrically connected at their inner ends respectively:

(i) to said terminal pads on said integrated circuit die;

(ii) to said one or more electrically conductive planar members on said second surface of said printed circuit board;

(iii) to said one or more electrically conductive planar members on said first surface of said printed circuit board; and (iv) to said electrically conductive heat sink member through said terminal pads on said second surface of said printed circuit board and said vias; and (e) a plastic encapsulating material which completely surrounds said integrated circuit die, said heat sink member, said printed circuit board, and said lead frame except for outer ends of said leads thereon.

14. The high performance plastic-encapsulated integrated circuit package of claim 13 wherein one or more of said electrically conductive vias extending through said printed circuit board make electrical contact with said metal heat sink member to which said printed circuit board is bonded to permit said metal heat sink member on said printed circuit board to function as a power or ground bus for said package.

15. The high performance plastic-encapsulated integrated circuit package of claim 13 wherein lead wires interconnect said leads on said lead frame with said terminal pads on said second surface of said printed circuit board and lead wires also interconnect said printed circuit board terminal pads with terminal pads on said die.

16. The high performance plastic-encapsulated integrated circuit package of claim 13 wherein lead wires connect said leads on said lead frame with said one or more electrically conductive planar members on said second surface of said printed circuit board and lead wires also interconnect said one or more electrically conductive planar members on said second surface of said printed circuit board with one or more terminal pads on said die.

17. The high performance plastic-encapsulated integrated circuit package of claim 13 wherein at least one of said one or more electrically conductive planar members on said second surface of said printed circuit board functions as a power or ground bus and two or more of said die terminal pads are electrically connected to said power or ground bus, 18. The high performance plastic-encapsulated integrated circuit package of claim 13 wherein at least one of said one or more electrically conductive planar members on said first surface of said printed circuit board functions as a power or ground bus and two or more of said die terminal pads are electrically connected through one or more of said terminal pads on said second surface of said printed circuit board and said vias thereunder to said power or ground bus.

19. A high performance plastic-encapsulated integrated circuit package characterized by both improved heat dissipation and low ground noise comprising one or more separate planes selected from the class consisting of a ground plane, a power plane, and combinations of same; and signal lines electrically connected to an integrated circuit die comprising:

(a) an electrically conductive rectangular heat sink member capable of dissipating heat and which also functions as a ground or power plane;

(b) a rectangular integrated circuit die centrally and directly mounted to a first surface of said heat sink member, while providing electrical insulation therebetween, and having die terminal pads formed thereon;

(c) a generally rectangular peripheral printed circuit board having a first surface which is insulatively bonded to said electrically conductive heat sink member coplanarly with said die and surrounding said die, said printed circuit board further comprising:

(i) one or more electrically conductive planar members formed on said first surface comprising at least one bus selected from the class consisting of a power bus, a ground bus, and combinations of same electrically connected to two or more of said die terminal pads;

(ii) a second surface having one or more electrically conductive planar members formed thereon comprising at least one bus selected from the class consisting of a power bus, a ground bus, and combinations of same electrically connected to two or more of said die terminal pads, and one or more terminal pads also formed thereon and electrically spaced from said one or more electrically conductive planar members on said second surface;

(iii) electrically conductive vias formed therein to respectively electrically connect one or more of said terminal pads on said second surface to one or more of said electrically conductive planar members on said first surface of said printed circuit board and to said electrically conductive heat sink member to which said printed circuit board is bonded;

(iv) a generally rectangular opening centrally formed therein which is larger than said rectangular integrated circuit die, whereby surrounds said centrally mounted die on said heat sink surface;

(d) a lead frame assembly insulatively bonded to said second surface of said printed circuit board comprising one or more leads electrically connected at their inner ends respectively to said terminal pads on said integrated circuit die, to said one or more electrically conductive planar members on said second surface of said printed circuit board, and to said one or more electrically conductive planar members on said first surface of said printed circuit board and said electrically conductive heat sink member through said terminal pads on said second surface of said printed circuit board and said vias; and (e) a plastic encapsulating material which completely surrounds said integrated circuit die, said heat sink member, said printed circuit board, and all of said lead frame except for outer ends of said leads thereon.

* * * * *